United States Patent
Vilain

(10) Patent No.: US 7,138,630 B2
(45) Date of Patent: Nov. 21, 2006

(54) BOLOMETRIC DETECTOR, INFRARED DETECTION DEVICE EMPLOYING SUCH A BOLOMETRIC DETECTOR AND PROCESS FOR FABRICATING THIS DETECTOR

(75) Inventor: Michel Vilain, Saint Georges de Commiers (FR)

(73) Assignee: Ulis, Veurey Voroize (FR)

( * ) Notice: Subject to any disclaimer, the term of this patent is extended or adjusted under 35 U.S.C. 154(b) by 149 days.

(21) Appl. No.: 10/954,828

(22) Filed: Sep. 30, 2004

(65) Prior Publication Data

US 2005/0082481 A1    Apr. 21, 2005

(30) Foreign Application Priority Data

Oct. 15, 2003    (FR) ................... 03 12042

(51) Int. Cl.
*G01J 5/02* (2006.01)
(52) U.S. Cl. ................................. 250/338.1
(58) Field of Classification Search ............. None
See application file for complete search history.

(56) References Cited

U.S. PATENT DOCUMENTS

| 5,021,663 | A | 6/1991 | Hornbeck |
| 5,367,167 | A | 11/1994 | Keenan |
| 5,399,897 | A | 3/1995 | Cunningham et al. |
| 5,912,464 | A | 6/1999 | Vilain et al. |
| 6,426,539 | B1 | 7/2002 | Vilain et al. |
| 2003/0209668 | A1* | 11/2003 | Tohyama .................. 250/338.1 |

FOREIGN PATENT DOCUMENTS

| FR | 2 796 148 A1 | 1/2001 |
| KR | WO 00/37906 A1 | 6/2000 |

* cited by examiner

*Primary Examiner*—Constantine Hannaher
(74) *Attorney, Agent, or Firm*—Burr & Brown

(57) ABSTRACT

A bolometric detector including a sensitive part having one or more layers of a sensitive material, the resistivity of which varies with temperature, electrodes isolated from one another, also acting as infrared radiation absorbers, the electrodes being in contact with the sensitive material over at least part of their surface, at least one support region for supporting the sensitive part, acting so as to position the sensitive part, and acting as an electrical conductor, in relation to a read circuit associated with the bolometric detector, and at least one thermal insulation structure electrically and mechanically connecting each support region to the sensitive part. The regions of sensitive material not in contact with the electrodes have at least one corrugation oriented along the direction perpendicular to the plane containing the sensitive part of the bolometric detector.

11 Claims, 5 Drawing Sheets

FIG. 3A
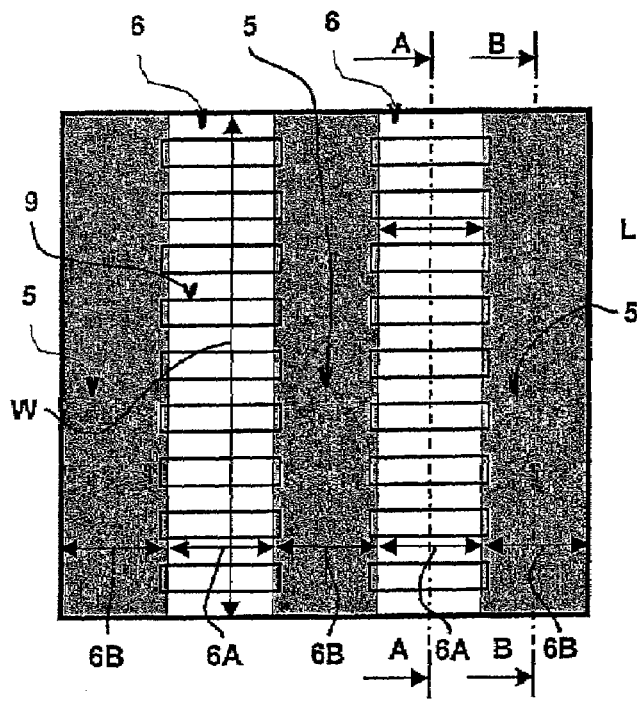
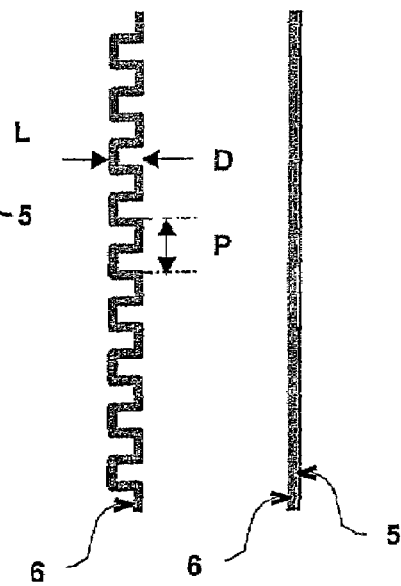
FIG. 3C  FIG. 3D
FIG. 3B
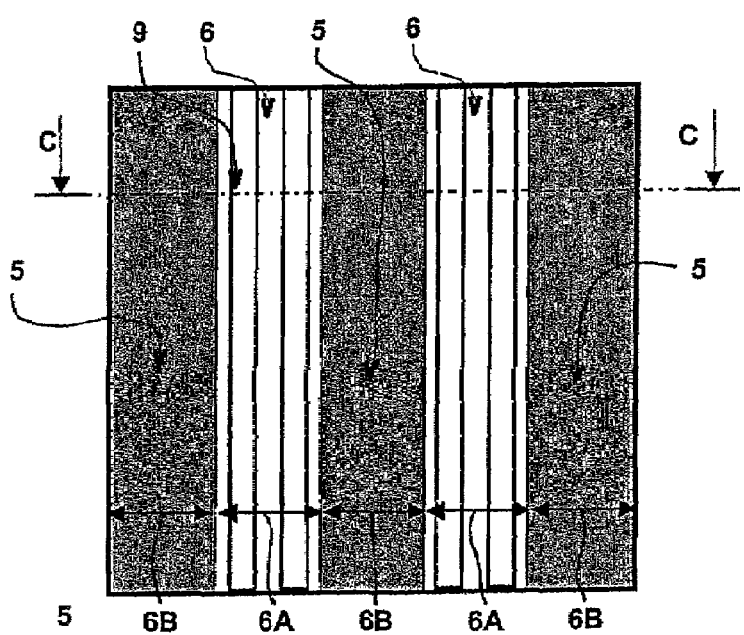
FIG. 3E
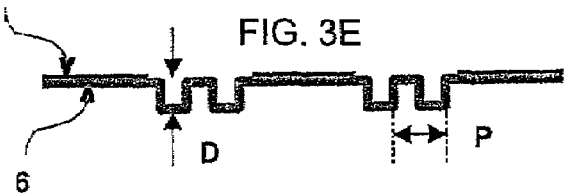

US 7,138,630 B2

BOLOMETRIC DETECTOR, INFRARED DETECTION DEVICE EMPLOYING SUCH A BOLOMETRIC DETECTOR AND PROCESS FOR FABRICATING THIS DETECTOR

CROSS-REFERENCE TO RELATED APPLICATION

This application claims the benefit of French Application 03.12042, filed Oct. 15, 2003, the entirety of which is incorporated herein by reference.

FIELD OF THE INVENTION

The present invention relates to a bolometric detector and to the infrared detection device employing such a detector. It also relates to the process of producing such a detector.

The field of application of the invention is especially in infrared imaging.

BACKGROUND OF THE INVENTION

Known in the field of infrared detectors are devices arranged in array form and capable of operating at room temperature, that is to say devices not requiring cooling, unlike the detection devices called quantum detectors which themselves require operation at very low temperature, typically at liquid nitrogen temperature.

These uncooled detectors conventionally use the change in a physical parameter of a suitable material as a function of temperature in the region of 300 K (540° R). In the case of bolometric detectors, this physical quantity is the electrical resistivity.

Such an uncooled detector generally combines:

means for absorbing the infrared radiation and converting it into heat;

means for thermally insulating the detector in such a way as to allow it to heat up under the action of the infrared radiation;

thermometry means, which in the context of a bolometric detector employ a resistive element; and means for reading the electrical signals delivered by the thermometry means.

Detectors intended for infrared imaging are produced in the form of an array of elementary detectors, in one or two dimensions, on a substrate, generally made of silicon, which includes means for electrically exciting the said elementary detectors and means for preprocessing the electrical signals generated by these elementary detectors.

These electrical excitation and preprocessing means are formed on the substrate and constitute a read circuit.

Monolithic integration of the detectors into the corresponding read circuit is advantageous from the standpoint of fabrication costs. However, it is also possible to hybridize a detector array on such a read circuit.

A device comprising an array of elementary detectors and an associated read circuit is generally placed in a case and connected, especially electrically, to the external environment by conventional techniques. In such a case, the pressure is reduced so as to limit the thermal losses. This case is furthermore provided with an infrared window transparent to the radiation to be detected.

To observe a scene by means of this detector, the scene is projected through a suitable optic onto the array of elementary detectors and the varying electrical stimuli are applied, via the read circuit (also provided for this purpose), to each of the elementary detectors or to each row of such detectors, so as to obtain an electrical signal constituting the image of the temperature reached by each elementary detector.

This signal undergoes relatively sophisticated processing by the read circuit, and then possibly by an electronic device external to the case, so as to generate a thermal image of the observed scene.

The performance of uncooled bolometric detectors depends essentially on:

controlling the production and integration of the most effective bolometric materials;

controlling the design and construction of the elementary detectors, in the form of microbridges, that is to say lightweight and delicate structures, thermally isolated from the read circuit;

the quality of application of these detectors and of the various correction functions that are used in the read circuit and in other ancillary devices; and controlling the techniques for packaging them in a low-pressure sealed case.

The present invention is more particularly aimed at controlling the design and construction of the microbridges. The aim of the invention is in fact to allow very effective bolometric detectors to be obtained using techniques that are relatively simple to employ.

The prior art describes a number of different ways of arranging the various constituent elements of the elementary detectors.

A distinction may principally be made between coplanar-electrode detectors and parallel-electrode detectors (i.e. having a "sandwich" structure). Document US-A-5 021 663 describes, for example, a bolometric detector of the type in question.

Although the invention is more readily applicable in coplanar-electrode detectors, in which the electrical current passing through the structure in operation flows in the plane of the elementary detector, it is also applicable in parallel-electrode detectors.

Document FR-A-2 752 299 describes a bolometric detector comprising a read circuit and one or more elementary detectors which themselves have a sensitive part integrating in particular a layer of bolometric material and two conducting electrodes, and at least one support element for this sensitive part, and in which layer the electrodes are interdigitated. FIG. 1 shows schematically a representation of this elementary bolometric detector.

In this detector, the read circuit (1) is covered with a reflective metal layer (2) intended to reflect the infrared radiation not absorbed by the bolometer itself, and placed about 1.5 to 2.5 µm (0.00006 in.–0.00010 in.) above the said reflector (so as to optimize the detection around a wavelength of 10 µm (0.00039 in.), corresponding approximately to the useful detection range of these detectors).

Such positioning is performed by means of essentially vertical structures (3). These structures, which will be called "pillars" in the rest of the description, are themselves electrically conducting and thus make it possible to transfer the excitation potentials to the conducting parts or electrodes (5) of the bolometric detector via elongate plane structures (4), which are also electrically conducting but thermally resistive. These elongate plane structures will be called "arms" in the rest of the description.

The thermal resistance, also called "thermal isolation", is intended to allow the bolometric material to heat up under the effect of the infrared radiation.

The volume between the body of the bolometer and the reflector is devoid of material away from the pillars (3), so as to prevent thermal losses through solid conduction. This volume is usually filled with a low-pressure gas so as to limit convection and conduction by the gas.

In this type of device, the read circuit applies, via the pillars (3) and the arms (4), and via at least two conducting parts or electrodes (5), an electrical current that passes through the structure parallel to the plane of the bolometric detector. This current flows through a bolometric material (6), the resistivity of which varies with temperature. The most widely used materials for this purpose are vanadium oxide and amorphous silicon.

The electrodes (5) are produced as a thin conducting layer, ordinarily made of metal. They also serve to absorb the infrared radiation. In FIG. 1A it may be seen that these electrodes are placed on the upper surface of the bolometric material (6). The internal surface suspended from the bolometer, that is to say away from the pillars (3) and arms (4) in FIG. 1A, almost always takes the form of virtually equipotential surfaces (5) and of resistive surfaces, the extent of which is defined by the spaces between the parts (5). In the rest of the description a distinction is made between the parts (6A) and the parts (6B) of the layer of bolometric material (6), depending on whether the excitation current passes through them (6A) or such a current does not pass through them (6B).

The performance of a bolometric detector is conventionally expressed by the NEdT (Noise Equivalent Differential Temperature).

It may be demonstrated, assuming that the bias level is sufficient for the electrical noise in the detector to be dominated by the low-frequency noise ($N_{bf}$), called "1/f noise", which is a characteristic in particular of amorphous materials, that the noise equivalent differential temperature is given by the equation:

$$\frac{1}{NEdT} = k(W \cdot L \cdot E)^{1/2} \cdot TCR \cdot R_{th}$$

in which:

k is a proportionality coefficient that is not worth explaining in detail here, which includes the bandwidth of the read circuit, the 1/f low-frequency noise level of the bolometric material (6), the area of the elementary detector and the infrared absorption efficiency of the elementary detector;

W and L are the electrical width and length respectively of the current lines through the bolometric material (6), these being shown in FIGS. 1A and 2A;

E is the thickness of the bolometric material (6) over the area relating to the current lines, the said area being defined by the dimensions W and L;

TCR is the relative resistance variation near the operating temperature (dR/RdT), which is a characteristic of the bolometric material employed, where R is the electrical resistance seen between the two current injection poles (the two pillars (3) and T is the temperature of the microbridge; and $R_{th}$ is the thermal resistance between the central "solid" part of the bolometer, which heats up under the effect of the infrared radiation, and the read circuit (1), the temperature of which is constant or very slightly variable.

This assumption is justified by the fact that the noise equivalent differential temperature derives from the calculation of the S/N, where S is the signal delivered by the detector and N is the electrical noise.

The detection signal S, proportional to the electrical current "i" flowing through the bolometer $$(S=K_1 \cdot i),$$

must be a maximum, while the low-frequency noise is also proportional to "i"

$$(N_{bf}=K_2 \cdot i).$$

Thus, when the electrical current is increased to improve the signal, a moment arrives when the low-frequency noise ($N_{bf}$) dominates over the other sources of noise that are independent of the current value, the "white" (frequency-independent) noise of which is typically generated by the bolometric detector.

The signal-to-noise ratio is optimum when it approaches its limit value $K_1/K_2$ for a sufficient value of the excitation current, even for materials that naturally have a low noise at low frequency.

The bolometer is therefore typically dominated by the 1/f noise under the bias conditions that optimize the noise equivalent differential temperature NEdT.

These various quantitative aspects may be found in document FR-A-2 796 148.

It is apparent from this equation that the detection performance of the bolometric detectors is related to the volume of bolometric material through which the lines of excitation current pass, that is to say equal to the product of the area (W·L) of the resistive parts (6A) multiplied by the thickness E of the said bolometric material.

The parts (6B) of the bolometric material, that is to say those through which the excitation current does not pass, do not contribute to the definition of the detection performance of the bolometric detector, as practically no current passes through the said bolometric material in these regions, these being much more electrically resistive than the layers that define the parts (5).

In the case of a detection array, the repeat pitch of the elementary detectors in the two dimensions of the plane is defined by "p".

To achieve optimum detection performance, all that is required, using the above analysis, is to arrange parts (6A) as a polygon of length L and width W, with $$L \cdot W = p^2$$

in order to optimize the detection performance.

This quantity $p^2$ represents the upper bound of the parameter L·W, since, from the technical standpoint, it is necessary to reserve part of the area $p^2$ for placing the spaces that separate the elementary detectors from one another, and at least the pillars (3), the arms (4) and the regions (6B), the area of which cannot be zero.

These quantities L and W in a typical arrangement have been shown in FIG. 1.

However, it is observed that the infrared radiation absorption rapidly decreases when the area of the electrodes (5) is reduced to the gain of the area of the surfaces (6A).

In practice, the best performance in terms of bolometric resolution is obtained when there is a balance between the area of the electrodes (5) and that of the regions (6A).

This means that about half of the internal area of the bolometer (that of the parts 6B) cannot be used to optimize the current lines, that is to say to maximize the total area L·W of the polygon(s) through which the current lines pass.

The expression for evaluating the bolometric resolution of NEdT also shows that the performance is improved if the thickness E of the layer of bolometric material (6) is increased as well as the dimensions of the quantities W and L.

However, such an increase in thickness correspondingly increases the thermal mass $C_{th}$ of the bolometer, this thermal mass appearing in the definition of the thermal time constant through the equation $$\tau_{th} = C_{th} \cdot R_{th},$$

which also constitutes one of the important parameters from the standpoint of the use of the bolometric detector as it defines the maximum rate at which the detector in question can follow a temperature change at any point in the observed scene.

According to document FR-A-2 752 299, the total thermal mass of the bolometric detector is largely determined by the mass of the bolometric material (6), and any increase in thickness of this layer is accompanied by an almost proportional increase in the overall thermal mass.

Consequently, the gain in thermal resolution NEdT achieved by this greater thickness of bolometric material is compensated for by the increase in the thermal time constant $\tau_{th}$. The overall optimization of the bolometer therefore assumes that the thermal time constant, and therefore the thickness of the layer of bolometric material (6), is adjusted to the maximum value compatible with the operating frequency envisaged by the user.

In other words, the thickness of the bolometric material is therefore not a free optimization parameter.

Thus, the bolometric detector according to document FR-A-2 752 299 cannot be improved in terms of noise equivalent differential temperature owing to the need to take into account the thermal time constant in order to allow effective use of such a bolometric detector.

To improve the noise equivalent differential temperature of a bolometric detector, the aforementioned document FR-A-2 796 148 proposes a configuration that relaxes the constraint associated with the quality of radiation absorption and of balancing the areas of the electrodes (5) and of the regions (6A) of the bolometric material.

According to the teachings of that document, the contact parts (6B) between the electrodes (5) and the bolometric material (6) are reduced to small areas of narrow elongate shape. Furthermore, the electrodes (5) are isolated from the bolometric material over essentially their entire surface by the insertion of an insulation layer (7).

This technique makes it possible to use most of the surfaces (6B) to optimize the polygon(s) of area W·L and thus obtain a substantial improvement in performance.

However, this result is obtained, on the one hand, by adding an additional mass, associated with the use of the insulating material (7), and stems, on the other hand, from a not insignificant increase in production complexity. It also has the drawback of resulting in a loss of performance owing to the pinching of the current lines around the ends of the parts (6B) in the case in which the electrodes (5) have an interdigitated configuration, as shown in FIG. 2A.

Now, this type of configuration is practically inevitable when a high-resistivity bolometric material, such as amorphous silicon and related materials, is used to obtain an electrical resistance R ranging from a few $10^5$ ohms to $10^6$ ohms, which is practical from the standpoint of the read circuit.

It should in fact be recalled that one of the difficulties that a person skilled in the art has to encounter when defining the structures of a bolometric detector is how to achieve an electrical resistance R around room temperature that is tailored to the options of the read circuit.

This is because not just any resistance value is necessarily practical to be employed with the type of read circuit that the designer of the system intends to use, and it is in general more practical, in order to optimize the functions of the read circuit, for this resistance R to be determined by constraints specific to this circuit, rather than by constraints generated by the bolometric detector as such. By neglecting the resistances constituted by the pillars (3) and the arms (4), this resistance is defined by the equation:

$$R = \rho \cdot L / (W \cdot E)$$

where $\rho$ is the electrical resistivity of the bolometric material in the vicinity of the opening temperature.

The configuration of the electrodes (5) straight away defines the width W and length L and the interdigitation, as for example shown in FIGS. 1A and 2A, and offers a certain degree of freedom.

However, the possible variations in the interdigitation of the electrodes (5) are not in practice very many with respect to the areas $p^2$ usually employed (less than 50·50 μm² (0.00197·0.00197 in.²) and with a pitch (width+space) of electrode designs of more than about 8 μm, in order to avoid diffraction phenomena between 8 and 14 μm (0.00031 in. and 0.00055 in.) in wavelength, that is to say within the wavelength range corresponding to infrared imaging.

The configuration of the current lines in the case shown in FIG. 2A can be modelled by, on the one hand, the three rectangular regions bordered by the parts (6B) in their parallel straight portion and, on the other hand, the two regions (8) corresponding to the ends of the parts (6B) internal to the bolometric detector.

In the rectangular regions, the density of the current lines is uniform and local quantities $W_r$ and $L_r$ are immediately defined in which the subscript r refers to the rectangular regions.

These regions define an electrical resistance equal to $R_s \cdot L / W$, where $R_s$ is the sheet resistance $$(R_s, \rho/E)$$

of the bolometric material.

In contrast, in the regions (8), the density of the current lines is variable, namely markedly higher in the vicinity of the tips of the regions (6B) than in the interior of the rectangular regions, and markedly lower in the vicinity of the opposite part (6B).

If the two regions (8) are grouped together in the form of a disk of internal radius $r_1$, taking $r_1$ as being the radius of the tips of the two regions (6B), then the external radius of these regions is $L+r_1$. In practice, $r_1$ may be likened to the half-width of the elongate feature of the parts (6B) of FIG. 2A.

It is readily demonstrated that the electrical resistance of this disk is given by the equation:

$$\frac{R_s}{2\pi} \cdot \ln \frac{L + r_1}{r_1}.$$

The width $W_t$ of the rectangle of length L equivalent to the regions (8), in which the subscript "t" relates to the tip regions, is given by the equation:

$$\frac{R_s L}{W_t} = \frac{R_s}{2\pi} \cdot \ln\frac{L+r_1}{r_1} \quad \text{i.e.} \quad W_t = 2\pi L/\ln\frac{L+r_1}{r_1}.$$

According to the example shown in FIG. 2A, for a bolometer with an overall size of 35 μm (0.00138 in.), including the space between adjacent bolometric detectors with L=6.5 μm (0.00026 in.) and $r_1$=0.5 μm (0.00002 in.) for example, this results in an equivalent electrical width $W_t$=15.5 μm (0.00061 in.) (for both regions (8)), substantially less than the length of the rectangular outline (in dotted lines in FIG. 2A) that would represent the maximum electrical width W that could be used near the regions (8) in order to optimize the produce W·L and therefore the noise equivalent differential temperature or thermal resolution of the bolometer. This length of the rectangular trace would in fact be about 28 μm (0.00110 in.) according to the scale of the realistic example shown in FIG. 2A. The effective total "electrical" width $$W = W_t + W_t$$

(a solid line along the central equipotential between the parts (6B)) would be close to 60 μm (0.00236 in.) for a maximum electrical width (shown by the dotted lines) of about 73 μm (0.00287 in.). This difference represents a loss of about 11% in performance compared with an ideal bolometric detector, which would not have localized tip effects.

To summarize, apart from the drawbacks already mentioned, the configuration proposed in that document could be improved as regards thermal resolution of the bolometric detector.

There has also been described, in document US-A-5 367 167, a bolometric detector comprising two coplanar electrodes located on the same face of the layer of bolometric material, and a conducting layer located on the other face of this layer of bolometric material. The function of this conducting layer is to absorb the infrared radiation that it is desired to detect and an electrically insulating layer must separate the conducting layer from the body of the detector. This therefore makes production very complex. Moreover, having to arrange the electrodes further apart restricts the application of this bolometric detector to low-resistivity bolometric materials, such as typically vanadium oxides.

SUMMARY OF THE INVENTION

The subject of the present invention consists of a bolometric detector of simple construction in which the distribution of the mass of bolometric material over the surface of the elementary detector is controlled, so that current lines pass through all or almost all of the mass of the said bolometric material for the purpose of achieving a better performance level for a given size and for a given thermal time constant. The aim of the invention is also to offer an additional degree of adjustment of the electrical resistance, for the same performance.

This bolometric detector comprises a sensitive part having one or more layers of a sensitive material, the resistivity of which varies with temperature and electrodes isolated from one another, also acting as infrared radiation absorber, the said electrodes being in contact with the sensitive material over at least part of their surface. The bolometric detector further comprises at least one support region for supporting the sensitive part, acting so as to position the said sensitive part, and acting as an electrical conductor, in relation to a read circuit associated with the bolometric detector, and at least one thermal insulation structure electrically and mechanically connecting each support region to the sensitive part. The regions of sensitive material not in contact with the electrodes have at least one corrugation in the direction perpendicular to the plane containing the sensitive part of the bolometric detector. The bolometric sensitive material consists of amorphous silicon or a related alloy of the $Si_x Ge_y C_z$ type in which $$x+y+z=1.$$

Thus, at the point where the prior art employs a plane surface, the invention employs one or more corrugations, making it possible to significantly increase the amount of bolometric material through which the current lines pass, and accordingly optimizes the performance of the detector, especially in terms of thermal resolution, without thereby increasing the mass of bolometric material.

Put another way, the invention consists in increasing the useful proportion of the total volume of bolometric material of the same time constant $\tau_{th}$. It will in fact be recalled that the increase in thickness of the said bolometric material, for the purpose of increasing the useful volume of this material, is not a free optimization parameter owing to the corresponding increase in this time constant that then occurs.

According to the invention, these corrugations may be parallel or perpendicular, or both at the same time in separate regions, to the current lines that pass through the structure when in operation. They may also be oriented obliquely relative to the said current lines.

According to the invention, the amplitude of the corrugations is less than the distance separating the electrodes from the constituent substrate of the read circuit, and is especially at most equal to 1.5 μm (0.00006 in.).

The invention also relates to an infrared detection device employing such a bolometric detector. Advantageously, the detector or detectors are fastened to the read circuit by means of a pillar-type structure (3). Furthermore, this device has an array structure comprising at least two bolometric detectors.

It also relates to a process for fabricating such a bolometric detector.

BRIEF DESCRIPTION OF THE DRAWINGS

The manner in which the invention can be realized and the advantages that stem therefrom will become more clearly apparent from the illustrative examples that follow, given by way of indication but implying no limitation, supported by the appended figures.

FIG. 3A is a schematic representation of a detail of a bolometric detector according to a first embodiment of the invention, seen in plan view and in section.

FIG. 3B is a schematic representation of a detail of a bolometric detector according to a second embodiment of the invention, seen in plan view and in section.

FIG. 3C is a sectional view taken through A—A of the bolometric detector shown in FIG. 3A.

FIG. 3D is a sectional view taken through B—B of the bolometric detector shown in FIG. 3A.

FIG. 3E is a sectional view taken through A—A of the bolometric detector shown in FIG. 3B.

DETAILED DESCRIPTION OF THE INVENTION

FIG. 3A therefore shows the central part of a bolometric detector according to the invention, especially of the part sensitive to the infrared radiation that such a detector is intended to detect.

Within this central part, the parts (6A) of the bolometric material, that is to say the parts without electrodes (5), have corrugations (9) over their entire surface, these being oriented perpendicular to the plane containing the said sensitive part, and as can be seen on the section A—A depicted in FIG. 3C.

These corrugations are defined by a pitch P and an amplitude D. If F is defined as the ratio of the deployed length of a corrugation (9) to the pitch P, the use of such corrugations (9), in the example described, oriented parallel to the direction of the current, decreases the resistance R, for constant thickness and constant resistivity of the bolometric material, by the ratio F, apart from an improvement in the thermal resolution NEdT by the ratio $F^{1/2}$.

In the embodiment shown in FIG. 3B, the corrugations (9) are oriented perpendicular to the direction of the current. This configuration results in an increase in the resistance R by the ratio F and an improvement in the thermal resolution NEdT also by the ration $F^{1/2}$.

Although the schematic representations of the said corrugations, on the sections A—A (FIG. 3C) and C—C (FIG. 3E) respectively, illustrate a perfectly rectangular shape, from the technical standpoint this is in fact not the case, owing to the detailed properties of the construction techniques. However, from the technical standpoint the corrugations used allow results of the same order to be achieved.

To give an example, it is possible to use a corrugation with a pitch of 2 µm (0.00008 in.) and a depth or amplitude D of 1 µm (0.00004 in.), this being easily achievable on a typical microbolometer for 20 to 50 µm (0.00079 in. to 0.00197 in.) edge imaging, this being so for all the parts (6A), that is to say the resistive spaces positioned between the equipotential electrodes (5).

In this case, the resistances are increased by a factor of 2 and the thermal resolution performance is improved by a factor of $2^{1/2}$, i.e. about 40%, which is very significant in the field of application of the present invention.

Figure 1B:
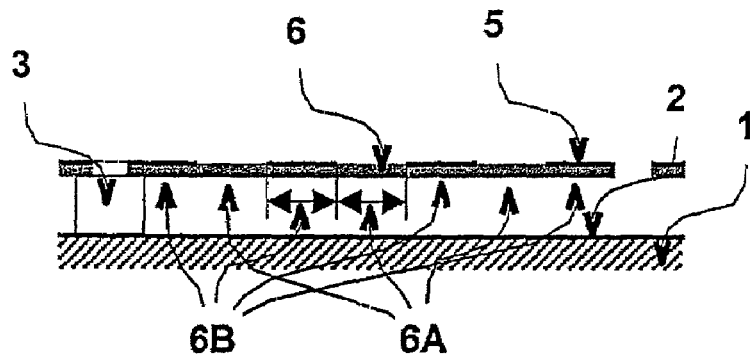
FIG. 1B is a view taken through A—A of the bolometric detector shown in FIG. 1A.
Figure 4B:
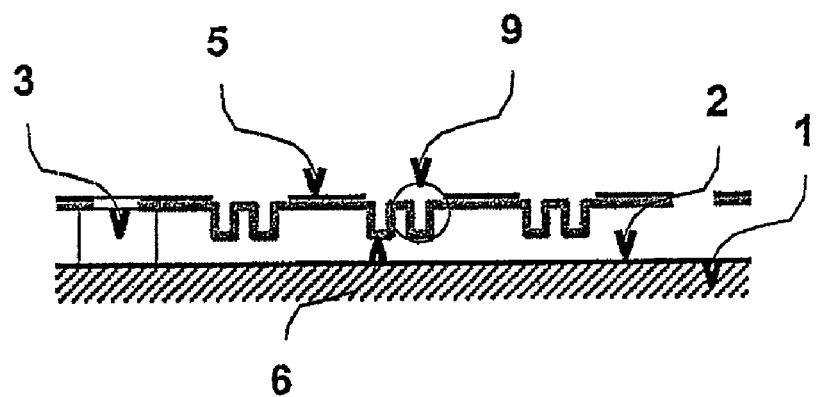
FIG. 4B is a sectional view taken through A—A of the bolometric detector shown in FIG. 4A.
Figure 4A:
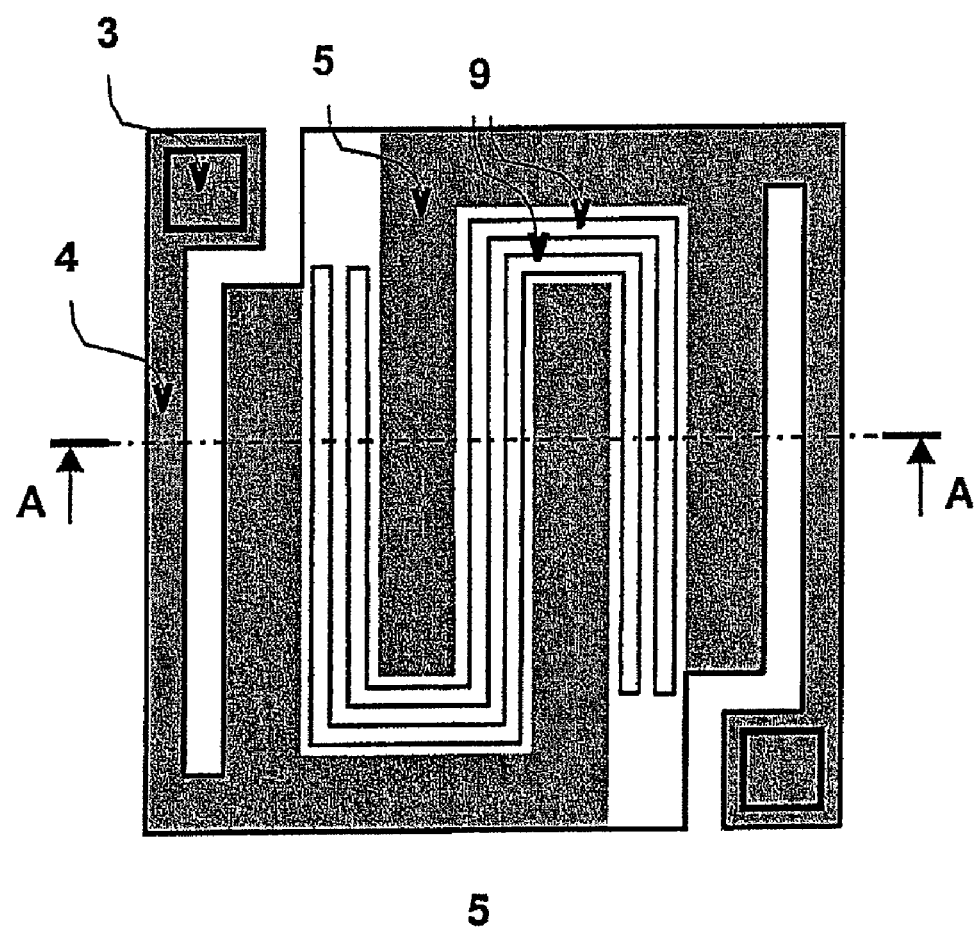
FIG. 4A is a schematic representation of a bolometric detector according to the invention, employed within the bolometric detector of FIG. 1A.

FIG. 4A illustrates the application of the invention to the bolometric detector of FIG. 1, that is to say the bolometric detector reproducing the teachings of document FR-A-2 752 299, in this case in the embodiment defined in FIG. 3B.

However, it could just as well be envisioned to use the embodiment of FIG. 3A, or indeed use, on the same bolometric detector, an embodiment of FIGS. 3A and 3B, with the aim of adjusting the local density of the current lines, taking into account the local spacing of the electrodes (5) or by consequently adjusting this spacing.

Thus, it is possible to reduce the local current density by inserting one or more corrugation segments oriented perpendicular to the direction of the current, and as a corollary to increase the local current density by inserting one or more corrugation segments oriented parallel to the direction of the current. The desired objective is to obtain a substantially uniform current density over all points in the regions (6A).

Furthermore, still according to the invention, it is possible to provide locally one or more corrugation segments oriented obliquely relative to the current lines, if it is desired to achieve a resistance value close to the resistance obtained in the absence of corrugation.

In the embodiment described in relation to FIG. 4A, the objective is to improve the thermal resolution NEdT for constant thickness E of bolometric material.

By doing so, this configuration allows the thermal resistance to be kept constant, especially in the case where the thermal insulation structures (4) are essentially formed by the layer of bolometric material (6).

In this configuration, the thermal mass and the time constant $\tau_{th}$ are increased, neglecting the thermal mass of the electrode (5), by a relative amount equal to:

$1+(F-1)\cdot W\cdot L/S$, where S denotes the area of the internal part of the bolometer where the bolometric material (6) is present, that is to say the sum of the areas of the parts (6A) and (6B).

In the configuration shown in FIG. 4A, the value of $W\cdot L/S$ is close to 0.4, and, for a reasonable value of the ratio F=2, the thermal time constant is increased by 40% for an improvement in the thermal resolution NEdT of the same order.

The configurations of the prior art, as shown in FIG. 1, could allow this same improvement of the factor $W\cdot L\cdot E$ to be achieved by increasing the thickness of the bolometric material by a factor of 2. However, using such a thickness of the bolometric material would result in a doubling of the thermal mass, and correspondingly would have reduced $R_{th}$ by a factor of 2, assuming that the arms (4) essentially consist of the layer (6).

In general, the thermal time constant would be maintained, but the thermal resolution NEdT would be reduced by a factor of $2^{1/2}$.

Figure 1A:
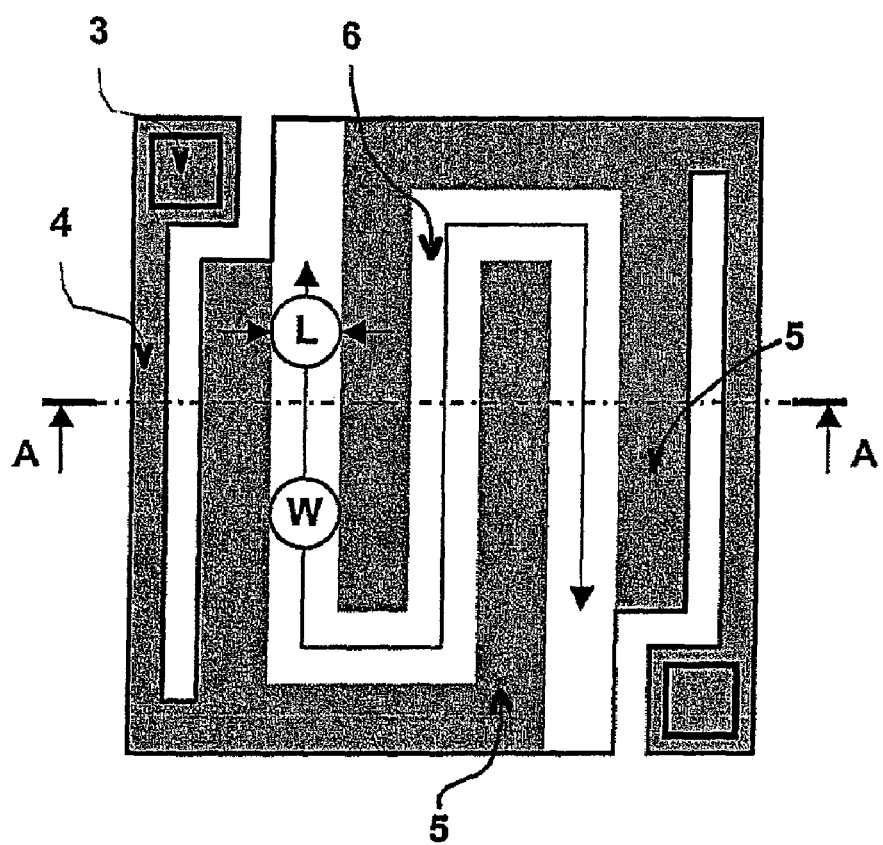
FIG. 1A is, as already mentioned, an illustration of an elementary bolometric detector according to the prior art.

By employing the invention in a bolometric detector of the type of that shown in FIG. 1A, it is possible to achieve, for the same thermal time constant, an improvement in thermal resolution, while still reducing the thickness of the layer of bolometric material by about 30%.

This improvement in thermal resolution NEdT is then about 18%, that is to say a very significant amount in the field in question, and this is achieved by the simple fact of adding corrugations.

The improvement in thermal resolution NEdT is around 54% if the increase in $R_{th}$ resulting from the reduction in thickness of the layer (6) is taken into account.

In the more general case in which the insulation structures (4) are made essentially independently of the thickness of the layer of bolometric material (6), which assumes a considerably more complex construction architecture, and the said structures are produced in such a way as to maintain the reference $R_{th}$, it is then beneficial to reduce the thickness of the said layer (6) of bolometric material in the central part of the bolometer, and at the same time to increase the corrugation factor F in order to keep the mass of bolometric material (and therefore $\tau_{th}$) constant, while still improving the thermal resolution.

In order to keep such a mass of bolometric material constant, while still achieving an optimum improvement in the thermal resolution NEdT, it is therefore necessary to employ the techniques needed to obtain as high a factor F as possible and to reduce the thickness E by a factor of $(1+(F-1)\cdot W\cdot L/S)$.

With a W·L/S value of 0.4 as used above as a typical value, a factor F of 3.5, combined with a reduction in thickness of the layer of bolometric material by a factor of 2, improves the resulting thermal resolution NEdT by about 32%, compared with the prior art for constant $\tau_{th}$.

Figure 2B:
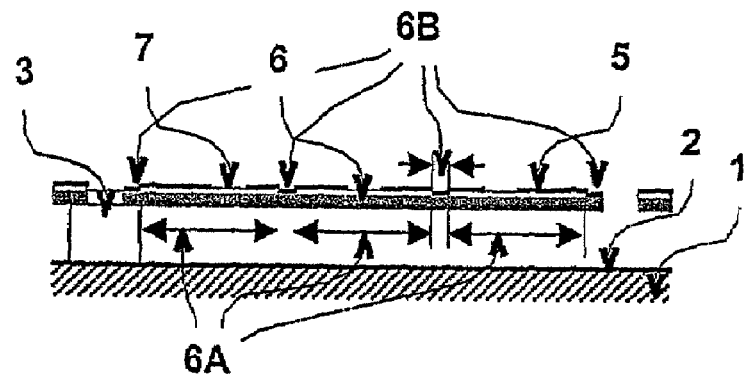
FIG. 2B is a sectional view taken through A—A of the bolometric detector shown in FIG. 2A.
Figure 2A:
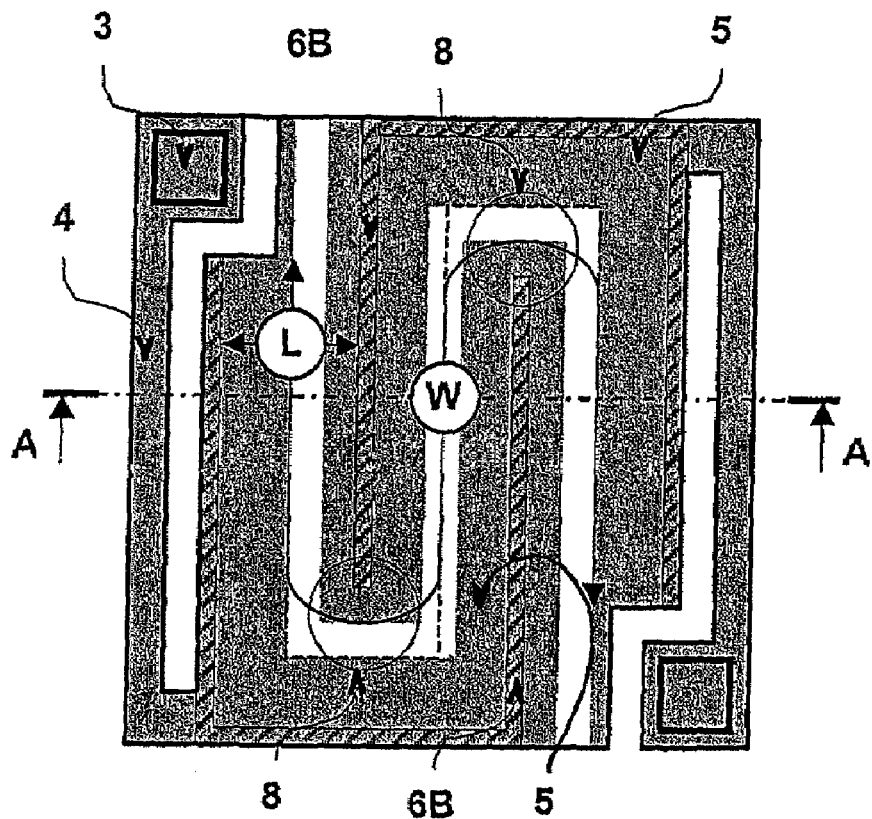
FIG. 2A is also a schematic representation of a bolometric detector according to the prior art.
Figure 5:
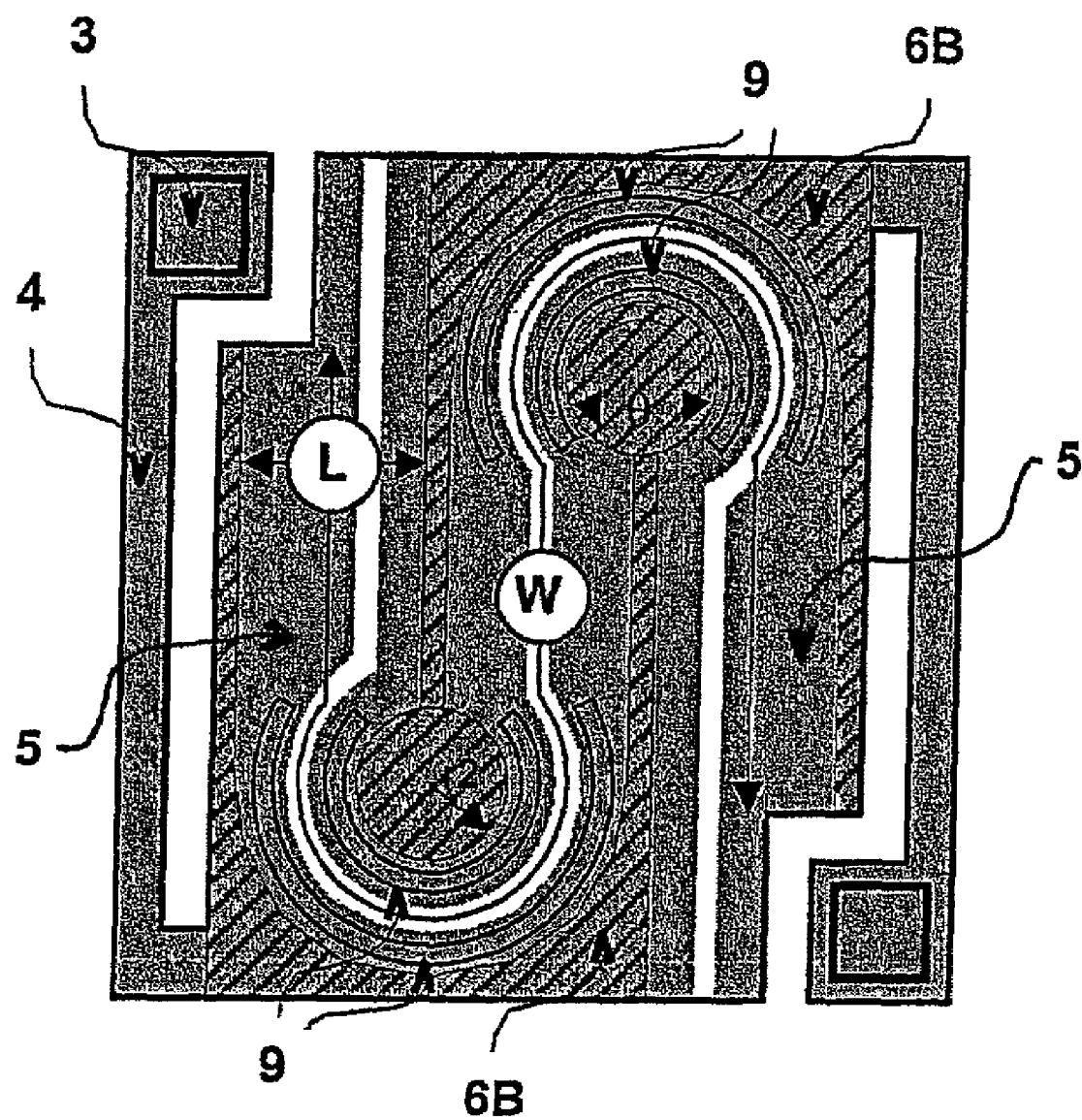
FIG. 5 is a schematic representation of a bolometric detector according to the invention, employed according to the techniques of the bolometric detector of FIG. 2.

According to another embodiment of the invention, shown in FIG. 5, the invention is used in the configuration of the bolometric detector of the prior art as illustrated in FIG. 2A.

More precisely, the ends of the narrow regions (6B) have been modified compared to this prior art, especially by the insertion of a disk or a substantially regular polygon, of radius $r_2$, substantially greater than half the width of the elongate part (6B) (previously denoted by $r_1$).

The opposite part (6B) is preferably rounded or polygonal, as illustrated in FIG. 5, so as to make the distance between the two parts (6B) almost constant, with the objective of maximizing the total current passing through the structure without generating a region in which the current intensity would be substantially higher than the average.

According to the invention, at least one corrugation (9) is produced in the gap between the two parts (6B) in such way that the deployed "electrical" length between these two parts is approximately equal to L.

In this way, the current density remains substantially constant along a central equipotential shown by the arrowed line of length W (W is the equivalent "electrical" width).

The electrical resistance between the two limits of the regions (6B) in their approximately circular part is then expressed by the equation:

$$\frac{R_s}{2\theta} \cdot \ln\frac{L+r_2}{r_2}$$

where θ represents the view angle of the corrugation(s) from the circular region.

Advantageously, the corrugations may be continued into one or more rectangular regions, under various optical absorption perturbation and mass reserves, as indicated above.

The width $W_t$ of the rectangle of "electrical" length L equivalent to the two modified regions (8) according to the invention is given by the equation:

$$\frac{R_s L}{W_t} = \frac{R_s}{2\theta}\ln\frac{L+r_2}{r_2} \quad \text{i.e.} \quad W_t = 2\theta \cdot L/\ln((L+r_2)/r_2).$$

The application of two corrugations ideally of square profile 0.5 μm (0.00002 in.) in amplitude to the configuration shown in FIG. 5 results in a central disk being drawn with a radius $r_2$ of about 2.5 μm (0.00010 in.) and an angle θ equal to $3\pi/2$. With a length L of 6.5 μm (0.00026 in.), with the dimensions indicated above, the result is a width $W_t$=48 μm (0.00189 in.).

The rectangular regions are reduced by about 33 μm in electrical width $W_r$ as a result of the insertion of the circular regions (8) according to the example described, the resulting overall electrical width $$W=W_t W_r.$$

then being close to 80 μm (0.00315 in.).

Compared with the configuration according to the prior art shown in FIG. 2A, in which W is close to 60 μm (0.00236 in.), this difference represents an improvement of about 15% in thermal resolution $((80/60))^{1/2}$ factor), that is to say better than the ideal configuration according to the dotted lines in FIG. 2A. The additional material needed to produce the corrugations as shown remains very moderate, as it is localized in the regions (8) where the tip effect described in relation to the analysis of the prior art is manifested, and it increases the time constant of the device only marginally (about 10%).

A process for producing a bolometric detector according to the invention will be described below.

Arrays of microbolometers are produced in a known manner from the read circuit as follows:

formation of an auxiliary layer, called a sacrificial layer, on the constituent substrate of the read circuit, especially one made of silicon, the said layer being intended to be removed by any known means after the detector has been produced, so as to thermally decouple the read circuit from the detection module, also called the sensitive part; and formation, on this sacrificial layer, of a layer of bolometric material and the electrodes.

This bolometer is produced, using conventional processes known to those skilled in the art, especially in the field of microelectronics, by successively depositing and etching various constitutive layers of the end product (dielectrics, bolometric material, metal materials for the equipotential regions or electrodes).

All the techniques to be used are described, for example, in detail in the various documents mentioned above. To carry out the invention, the corrugations are formed using conventional lithography and dry etching processes, well known to those skilled in the art, on the surface of this sacrificial layer, which is usually made of polyimide with a thickness of between 1.5 and 3 μm (0.00006 in. and 0.00012 in.), just before the first constituent material of the bolometric detector is deposited.

It is also within competence of a person skilled in the art to define whether it is necessary to trace the profile (9) of the corrugations parallel to the current lines or orthogonally thereto, so as to adjust the overall electrical resistance R of the device towards values that optimize or facilitate its implementation in relation to the possible constraints generated by the configuration of the read circuit, and even to use both forms simultaneously on the same elementary bolometric detector, depending on the space available and the desired configuration of the current lines within the device.

In this regard, it should be recalled that the invention may be implemented solely for this purpose of adjusting the resistance in a given space by a means other than by adjusting the thickness, resistivity or arrangements of the equipotential regions (6B).

Thus, to implement the invention according to the configuration of FIG. 4, and according to a preferred embodiment, it would be necessary to insert a lithographic level in order to define the corrugations, and then to carry out partial etching of the sacrificial layer, in the description of the preferred embodiment that is provided in document FR-A-2 752 299.

Within the context of the embodiment described in relation to FIG. 5, it is possible, in a first embodiment, to produce the corrugations inscribed in the parts (5), which avoids having to etch the material of the said parts (5) in the relief of the corrugations, if the latter are produced before the layer (5) is deposited. If the corrugation profile is abrupt, this operation may be tricky. It may thus be advantageous on the contrary to design these corrugations on the outside of the parts (5) so as not to constrain the dielectric material (7) with a high quality of insulation on the inside of the corrugations. This option was adopted in the case of the following development.

An advantageous embodiment according to the configuration of FIG. 5 is described below.

Starting from a substrate, especially made of silicon, a reflective metal layer is deposited and a first lithographic level is applied in order to separate the features of the reflector by etching.

The process then continues with the deposition and conventional treatment of the sacrificial layer (1.8 to 2.5 μm (0.00007 in. to 0.00010 in.) in thickness) typically made of polyimide. An insulator, typically silicon oxide or a silicon nitride (10 to 100 nanometres (0.0000004 in. to 0.0000040 in.) in thickness) is then optionally deposited on the surface of the polyimide.

The conducting layer (5), typically made of titanium nitride, is then deposited so as to obtain a layer resistance of 150 to 400 ohms, and a second lithographic mask is applied and the layer (5) is etched so as to expose the surfaces where the corrugations (9) will be etched.

A second dielectric layer is then deposited this having the same or similar thickness and being of the same type as the first dielectric layer, a third lithographic mask is applied and these dielectrics are etched according to the surfaces (6B), and also on the parts (3).

A fourth lithographic mask is then applied in order to etch, in the surface layers and the polyimide, the impression for the pillars (3).

A metallic material is then deposited, using known techniques, in order to form the pillars (3) and a fifth lithographic mask is applied in order to etch this metallic material away from the parts (3).

Next, a sixth lithographic mask is applied in order to define the corrugations (9) according to the invention and then the dielectric layers are etched in the form of the corrugations over a depth (amplitude) of typically 0.5 μm to 1 μm (0.00002 in. to 0.00004 in.) in the sacrificial polyimide layer.

The profile of the corrugations is defined by the detailed masking and etching process control techniques well known to those skilled in the art. The fact of forming corrugations during the process rather than before any polyimide surface deposition has the advantage of removing all or part of the mass of materials not involved in the current lines (here, one or two dielectric layers) on the surfaces involved in the etching of the corrugations.

The process then continues with the deposition of the bolometric material, typically, but not limitingly, amorphous silicon or a related material of the $Si_xGe_yC_z$ type where x, y and z have a value between 0 and 1, with $x+y+z=1$, it being possible for this material to be doped with boron or with phosphorous and extending over a thickness of between 50 and 300 nanometres (0.0000020 in. and 0.0000118 in.).

The bolometric material may also consist of vanadium oxide or a mixture of vanadium oxides of various compositions (of general formula $VO_x$).

An important criterion for success in applying the present invention is for the corrugation to be properly covered with the bolometric material, which can be achieved without difficulty, in particular with amorphous silicon and the related materials, these being synthesized very generally by CVD (Chemical Vapour Deposition).

A seventh lithography level is then applied in order to define the outlines of the elementary detectors and the thermal isolation arms (4) and to protect the pillars (3), and to etch all the layers present away from the pillars (3) down to the sacrificial layer.

Advantageously, an additional lithographic level may be applied before the preceding seventh level, so as to remove the bolometric material on the surface corresponding to the parts (3), in order to improve the thermal resistance.

The production process is completed by cutting the substrates into finished individual products, and by removing the sacrificial layer.

Although the precise order of the operations indicated above for obtaining the finished product is not limiting, it is however necessary to carry out the texturing, that is to say the etching of the corrugations, prior to the deposition of the bolometric material before one of these deposition operations, if there are several of them in the process.

The detailed embodiments of the invention, according to the configuration of FIG. 4, will be readily apparent to those skilled in the art from the plan and sectional view of the structures, and with the aid of the process described above.

The corrugation features produced in the form of hollows with respect to the plane surface of the sacrificial layer may also be produced in relief. In this case, and so as to prevent, especially if it is desired to produce corrugations of large amplitude, the lower crests of the corrugations from approaching too close to the surface of the read circuit, it then suffices to reverse the polarity of the design of the lithographic mask employed, so as to preserve the relief parts of the final corrugation.

If the low-frequency noise ($N_{bf}$) constitutes a key factor, the detector according to the invention is produced in such a way that the local current density is approximately constant over the surface of the active bolometric material (defined by a small part of the regions 6A), since the noise would be greater in the regions where the current density is higher. It is for this reason that the corrugations are distributed uniformly in the available space of the parts (6A) in FIGS. 3A and 4A and that, moreover, the corrugation features (9) are made to extend onto the limits of the adjacent equipotential parts (5) in FIG. 3A. These arrangements optimize the result but do not amount to a necessary feature.

Within the context of the invention, it is also necessary to limit the regions provided with corrugations to the surfaces that have little or no optical absorption function, unless the amplitude D is small (typically less than 1 μm (0.00004 in.) for a bolometric detector intended for detecting within a wavelength range of between 8 and 14 μm (0.00031 in. and 0.00055 in.) compared with the range of wavelengths to be absorbed, without which the radiation absorption could not be optimum.

Furthermore, producing corrugations on surfaces having electrodes (5), especially in FIGS. 1A and 3A, would unnecessarily increase the mass of the bolometric material not involved in the current lines and is therefore unnecessary as regards detection performance.

Finally, it is also necessary to maintain the pitch P of the corrugation substantially below the mean wavelength to be detected, typically at most equal to 3 µm (0.00012 in.), unless the diffractive effect is deliberately sought.

The benefit of the bolometric detector according to the invention will consequently be apparent in so far as it makes it possible, in a simple manner, to optimize its detection characteristics without affecting the other parameters associated with its operation, especially those dictated by the read circuit to which it is associated.

The invention claimed is:

1. Bolometric detector comprising:
   a sensitive part having
      one or more layers of a bolometric sensitive material consisting of at least one of an amorphous silicon and a related alloy of the $Si_xGe_yC_z$ type in which $x+y+z=1$, the resistivity of which varies with temperature,
      electrodes isolated from one another, the electrodes acting as infrared radiation absorbers and being in contact with the sensitive material over at least part of their surface, and
      regions of sensitive material not in contact with the electrodes having at least one corrugation oriented along a direction perpendicular to a plane of the sensitive part, each corrugation having exposed surfaces defined by the sensitive material;
   at least one support region for supporting the sensitive part positioning the sensitive part, and acting as an electrical conductor, in relation to a read circuit associated with the bolometric detector; and
   at least one thermal insulation structure electrically and mechanically connecting each support region to the sensitive part.

2. Bolometric detector according to claim 1, wherein the corrugation is oriented parallel to the current lines that pass through the sensitive part of the detector when in operation.

3. Bolometric detector according to claim 1, wherein the corrugation is oriented perpendicular to the current lines that pass through the sensitive part of the detector when in operation.

4. Bolometric detector according to claim 1 further comprising several regions of corrugation that are positioned in different areas, the corrugations being respectively oriented parallel and perpendicular to the current lines that pass through the sensitive part of the detector when in operation.

5. Bolometric detector according to claim 1, wherein the corrugation is oriented obliquely relative to the current lines that pass through the sensitive part of the detector when in operation.

6. Bolometric detector according to claim 1, wherein an amplitude of the corrugation is less than the distance separating the electrodes from constituent substrate of the read circuit.

7. Bolometric detector according to claim 6, wherein the amplitude of the corrugation is at most 1.5 µm.

8. Bolometric detector according to claim 1, wherein the pitch of plurality of said corrugations is at most three micrometers.

9. Bolometric-type infrared detection device, comprising at least one bolometric detector according to claim 1, the detector being fastened to the read circuit by a pillar-type structure.

10. Bolometric-type infrared detection device according to claim 9, comprising a plurality of bolometric detectors arranged in an array structure.

11. Process for producing a bolometric detector, the process comprising the steps of:
   providing a read circuit produced on a silicon substrate;
   forming a sacrificial auxiliary layer on the said silicon substrate;
   locally etching the sacrificial auxiliary layer to correspond to the desired shape of at least one corrugation oriented along a direction perpendicular to a plane of the first sacrificial auxiliary layer;
   forming, on this sacrificial auxiliary layer, a layer of bolometric material made of one of an amorphous silicon and a related material of the $Si_xGe_yC_z$ type in which $x+y+z=1$;
   forming electrodes along regions of the bolometric material without corrugations, the electrodes for sending electrical signals needed to operate the bolometric detector and for conveying the signal resulting from the detection by the said bolometer of the infrared radiation to the read circuit; and
   removing the sacrificial auxiliary layer entirely.

* * * * *